(12) United States Patent
Liu (10) Patent No.: US 7,728,669 B2
(45) Date of Patent: Jun. 1, 2010

(54) OUTPUT STAGE CIRCUIT AND OPERATIONAL AMPLIFIER THEREOF

(75) Inventor: Chang-Shun Liu, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 21 days.

(21) Appl. No.: 12/266,073

(22) Filed: Nov. 6, 2008

(65) Prior Publication Data

US 2009/0115524 A1    May 7, 2009

(30) Foreign Application Priority Data

Nov. 7, 2007    (TW) ............................. 96141966 A (51) Int. Cl.
*H03F 3/45* (2006.01)
(52) U.S. Cl. .................... 330/255; 330/261; 330/253
(58) Field of Classification Search ............... 330/255, 330/261, 253
See application file for complete search history.

(56) References Cited

U.S. PATENT DOCUMENTS

| 4,048,575 | A | * | 9/1977 | Musa | 330/253 |
| 4,267,517 | A | * | 5/1981 | Iida et al. | 330/253 |
| 4,462,002 | A | * | 7/1984 | Schade, Jr. | 330/253 |
| 7,248,104 | B2 | * | 7/2007 | Wang | 330/9 |
| 7,414,474 | B2 | * | 8/2008 | Yamada et al. | 330/255 |
| 7,474,153 | B1 | * | 1/2009 | Dasgupta | 330/255 |

OTHER PUBLICATIONS

De Langen et al., "Compact Low-Voltage Power-Efficient Operational Amplifier Cells for VLSI, IEEE Journal of Solid State Circuits," Oct. 1998, pp. 1482-1496, vol. 33, No. 10.

* cited by examiner

*Primary Examiner*—Patricia Nguyen
(74) *Attorney, Agent, or Firm*—Muncy, Geissler, Olds & Lowe, PLLC (57) ABSTRACT

The present invention relates to an output stage circuit and an operational amplifier thereof. In the output stage circuit, one of a gate of a transistor is coupled to a gate of a bias transistor and a level shifter in response to a small signal outputted from an amplifying circuit in the operational amplifier. In addition, a gate voltage of the bias transistor is controlled by a voltage generating circuit to control a DC bias of the transistor of the output stage circuit. Therefore, extra frequency compensating components for compensating the transistor of the output stage circuit is no longer necessary, and saving circuit layout area and cost can be achieved by the present invention.

24 Claims, 7 Drawing Sheets

OUTPUT STAGE CIRCUIT AND OPERATIONAL AMPLIFIER THEREOF

This application claims the benefit of the filing date of Taiwan Application Ser. No. "096141966", filed on "2007 Nov. 7", the content of which is incorporated herein by reference.

BACKGROUND OF THE INVENTION

1. Field of the Invention

The present invention relates to an amplifier, and more particularly, to an output stage circuit and an operational amplifier thereof.

2. Description of the Related Art

In analog circuit, the output stage circuit plays the role of driving the load in the condition of less gain decreasing.

Figure 1:
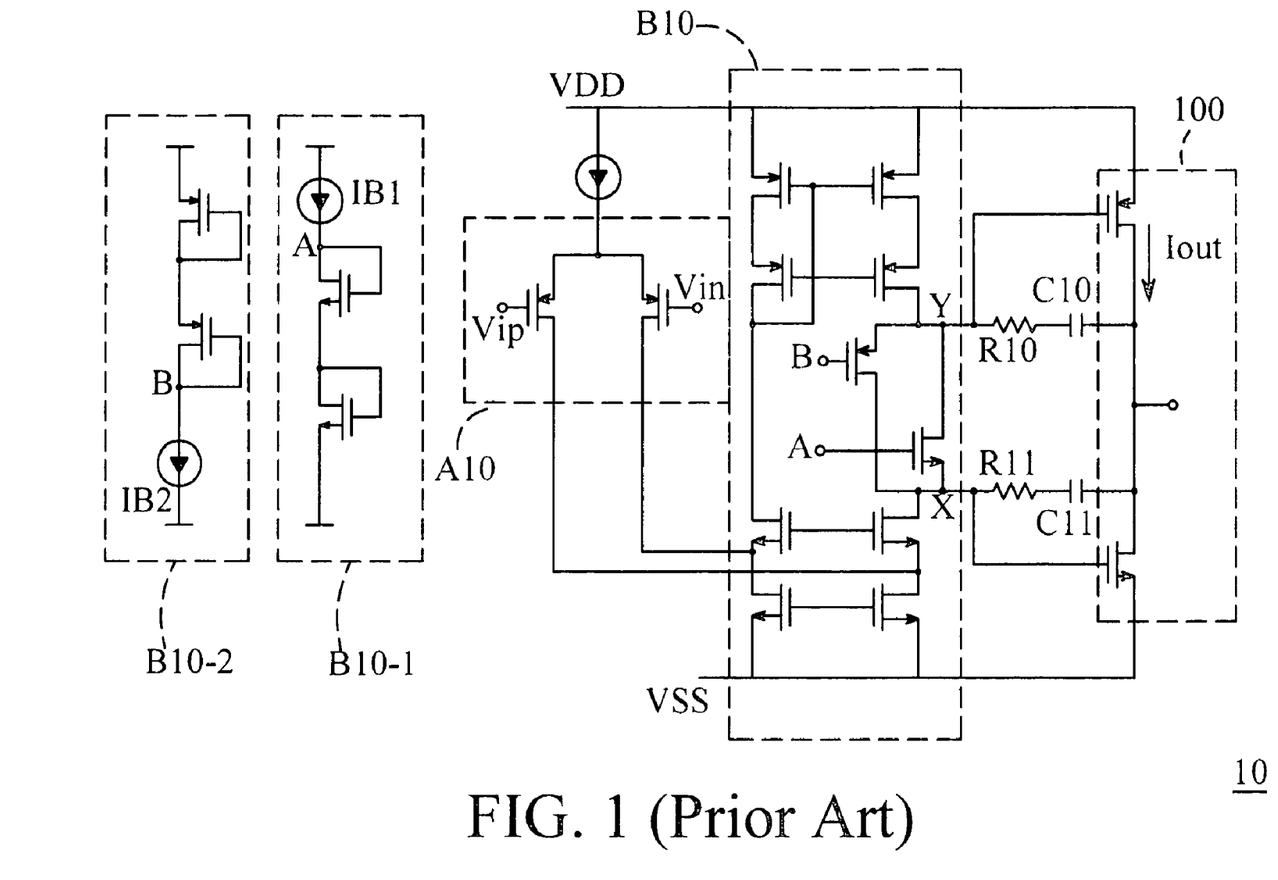
FIG. 1 illustrates a circuit diagram depicting a complementary metal-oxide semiconductor (CMOS) operational amplifier with class AB output stage 100 in the reference [1]

FIG. 1 illustrates a circuit diagram depicting a complementary metal-oxide semiconductor (CMOS) operational amplifier with class AB output stage 100 in the reference [1]. Referring to FIG. 1, the operational amplifier 10 includes a class AB output stage 100, two resistors R10 and R11, two capacitors C10 and C11, an amplifying circuit A10 and a bias circuit B10, wherein the bias circuit B10 includes two sub bias circuits B10-1 and B10-2. For the explanation of the operation of the operational amplifier 10, in this circuit diagram, and a plurality of nodes A, B, X and Y are marked. The sub bias circuits B10-1 and B10-2 respectively control voltages of nodes A and B through the current sources IB1 and IB2 therein, so as to respectively control the bias voltages of nodes X and Y. Thus, the bias current Iout of the class AB output stage 100 is proportional to the currents of IB1 and IB2.

The bias method of the class AB output stage 100 has advantages of fast frequency response. Nevertheless, this circuit scheme must adopt a bias circuit B10 using the folded-cascode configuration for biasing the class AB output stage. According to the description above, apparently, the circuit at least has two disadvantages as follow:

1. The control of steady current is inaccurate due to channel length modulation.
2. This circuit cannot be applied in lower supply voltage due to $2V_{GS}$ requirement in the nodes A and B. For example, in UMC 0.35 μm fabricating process, the threshold voltage of p-type MOSFET (VTP) is about 0.8V. It should be considered the slow corner effect and the overdrive voltage about 0.1V. Thus, this circuit cannot be operated in the condition of VDD−VSS<2V.

Figure 2:
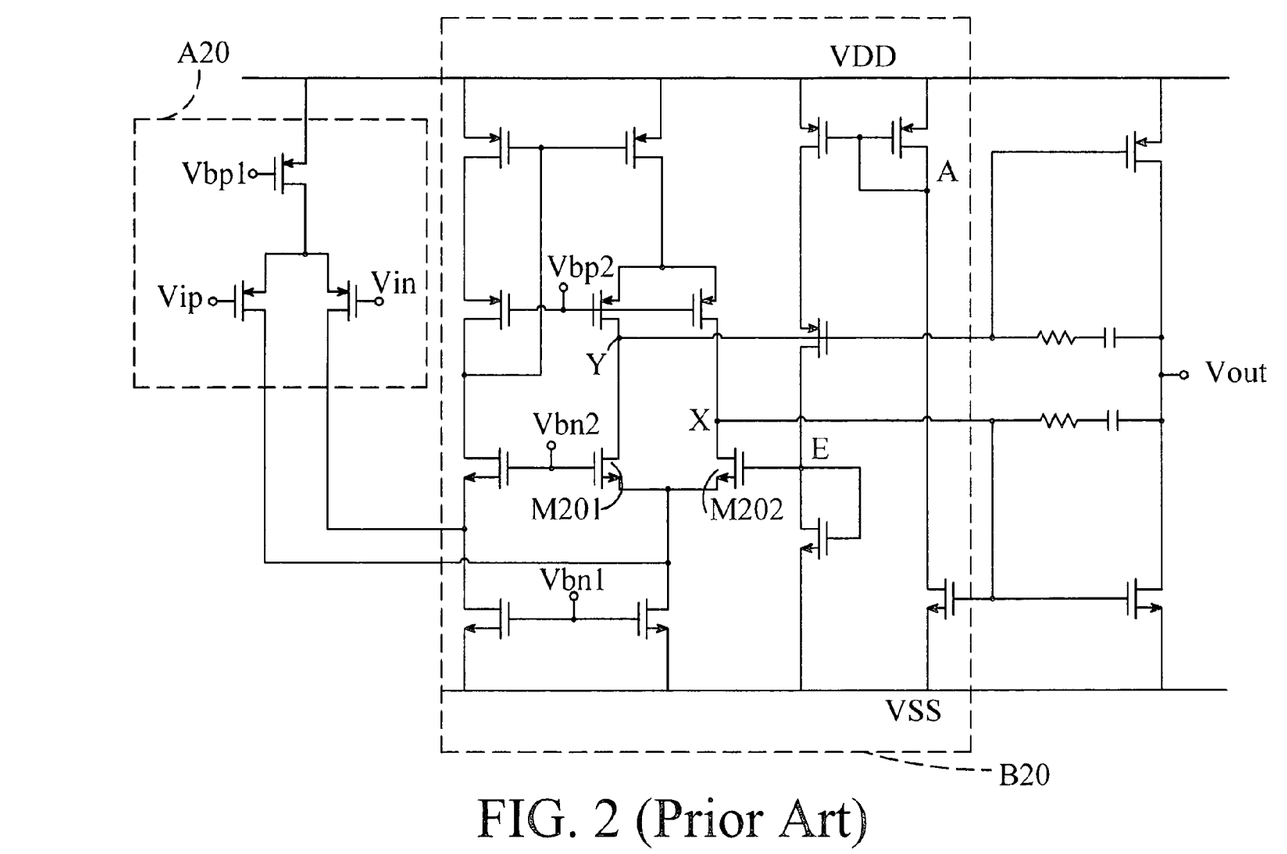
FIG. 2 illustrates a circuit diagram depicting an operational amplifier for improving the operational amplifier of FIG. 1 in the reference [1]

FIG. 2 illustrates a circuit diagram depicting an operational amplifier for improving the operational amplifier of FIG. 1 in the reference [1]. Referring to FIG. 1 and FIG. 2, there are 4 transistors cascaded in the bias circuit B20 in FIG. 2, and comparatively, there are 5 transistors cascaded in the bias circuit B10 in FIG. 1. Apparently, the operational amplifier in FIG. 2 is more proper to be applied in the condition of the low supply voltage. Since the transistors M201 and M202 of the bias circuit B20 is configured as a differential pair, it can control the voltage difference between the node X and the node Y as long as the adapted DC voltage is properly given to the node E. In the small signal operation, the voltages of the node X and the node Y varies in the same phase as the output signal of the amplifying circuit A20. At this time, the voltage of the node A is varied as the voltages of the node X and the node Y, so that the voltage difference between the node X and the node Y is consequentially varied. Therefore, the output signal Vout outputted from the class AB output stage circuit O20 will be distorted.

Reference [1] K. J. de Langen, J. H. Huijsing, "Compact Low-Voltage Power-efficient Operational Amplifier Cells for VLSI", IEEE Journal of Solid-State Circuits, vol. SC-33, pp. 1482-1496. October 1997.

SUMMARY OF THE INVENTION

In view of the above-mentioned problems, the present invention is direct to an output stage circuit for reducing the interference and the distortion of the output signal when the output signal is in process.

In addition, the present invention is directed to an operational amplifier for operation in the condition of the low supply voltage.

To achieve the above-mentioned object and others, an output stage circuit adapted enhancing a driving capability of an output signal outputted from an amplifying circuit is provided in the present invention. The output stage circuit includes a first node, a second node, a first transistor, a second transistor, a third transistor, a fourth transistor, a fifth transistor, a sixth transistor, a first current source, a second current source and a differential value amplifying circuit. A first source/drain terminal of the first transistor is coupled to a first common voltage and the gate terminal thereof is coupled to the first node. A first source/drain terminal of the second transistor is coupled to a second source/drain terminal of the first transistor, a second source/drain terminal thereof is coupled to a second common voltage, and a gate terminal thereof is coupled to the second node. A first terminal of the first current source is coupled to the first common voltage. A first source/drain terminal of the third transistor is coupled to a second terminal of the first current source, a second source/drain terminal thereof is coupled to the first node, and a gate terminal thereof receives a control voltage. A first source/drain terminal of the fourth transistor is coupled to the second terminal of the first current source, a second source/drain terminal thereof is coupled to the second node, and a gate terminal thereof receives a first constant bias. A first source/drain terminal of the fifth transistor is coupled to the first node, and a gate terminal thereof receives a second constant bias. A first source/drain terminal of the sixth transistor is coupled to the second node, and a gate terminal thereof receives the second constant bias. A first terminal of the second current source is coupled to second source/drain terminals of the fifth transistor and the sixth transistor and receives the output signal outputted from the amplifying circuit. A second terminal of the second current source is coupled to the second common voltage. The differential value amplifying circuit is used for comparing the voltage difference between the first node and the second node with a constant differential value to generate the control voltage so as to control the voltage difference between the first node and the second node with in a preset range.

An operational amplifier is provided in the present invention. The operational amplifier includes a amplifying circuit, a bias circuit, a output stage circuit and a differential value amplifying circuit. The amplifying circuit is used for outputting a first output signal. The bias circuit outputs a first input voltage and a second input voltage according to a control voltage and the first output signal, wherein the control voltage is used for controlling the direct current (DC) bias components of the first input voltage and the second input voltage, and the first output signal is used for controlling the voltage difference between the first input voltage and the second input voltage. The output stage circuit output an output signal according to the first input signal and the second input signal. The differential value amplifying circuit is coupled to the output stage circuit, and used for comparing the voltage difference between the first input voltage and the second input voltage with a constant differential value to generate the control voltage so as to control the DC bias components of the first input voltage and the second input voltage within a preset range.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

EMBODIMENT OF THE INVENTION

Figure 3:
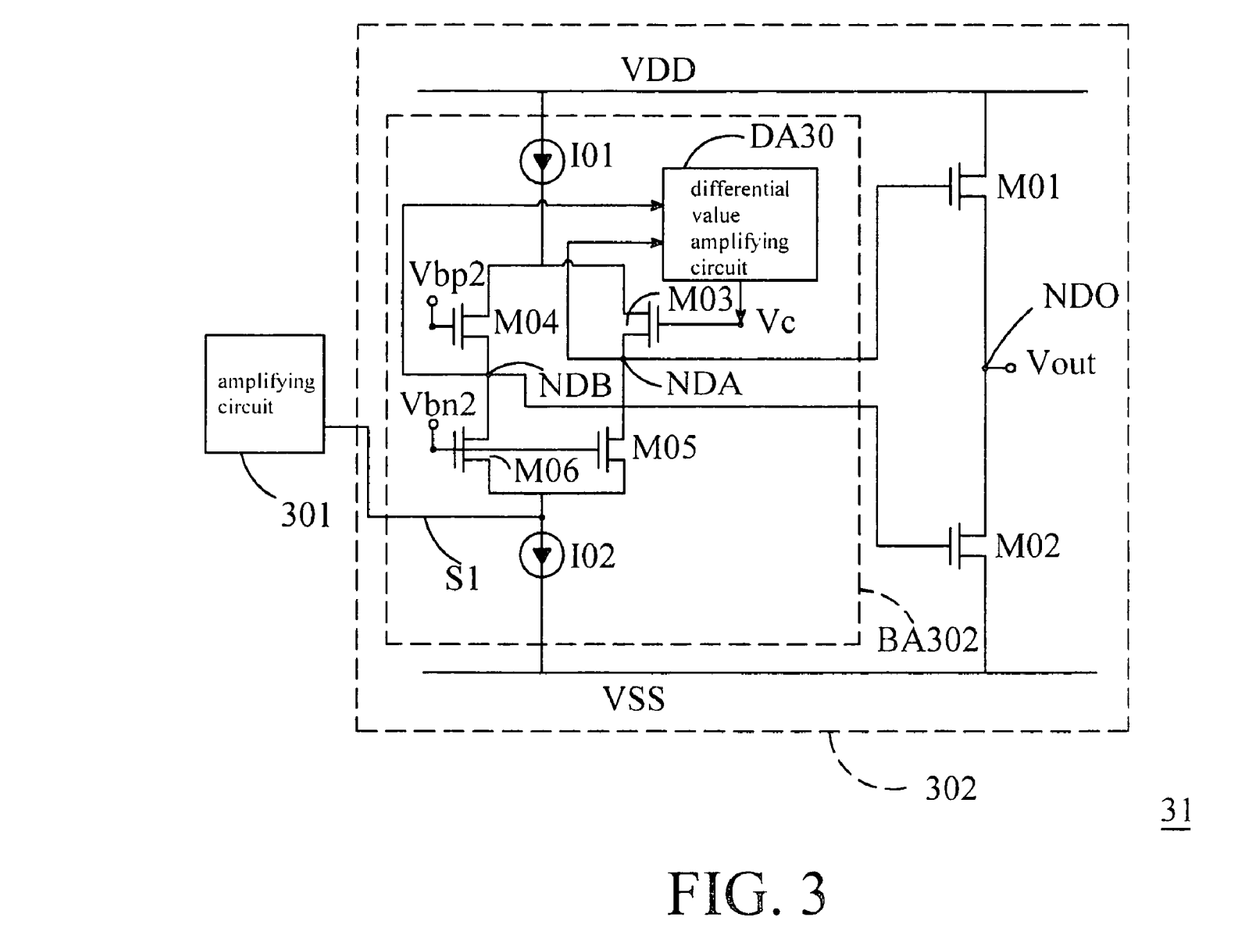
FIG. 3 illustrates a detail circuit diagram of the operational amplifier 31 according to an embodiment of the present invention.

FIG. 3 illustrates a detail circuit diagram of the operational amplifier 31 according to an embodiment of the present invention. Referring to FIG. 3, the operational amplifier 31 includes an amplifying circuit 301 and an output stage circuit 302, wherein the output stage circuit 302 includes a first transistor M01, a second transistor M02 and a bias circuit BA302. The bias circuit BA302 includes a third transistor M03, a fourth transistor M04, a fifth transistor M05, a sixth transistor M06, a first current source 101, a second current source 102 and a differential value amplifying circuit DA30. The coupling relationship is shown in FIG. 3. For convenience of explanation, a first common voltage VDD, a second common voltage VSS and a plurality of nodes NDA, NDB and NDO are marked. The first common voltage VDD generally is a power supply voltage and the second common voltage VSS generally is a ground voltage. Nevertheless, the common voltages VDD and VSS can be changed according to different applications, for example, the second common voltage VSS can be equal to −VDD in some analog application. The present invention is not thus limited herein.

The first transistor M01 and the second transistor M02 in the output stage circuit 302 is mainly used for driving a load. In this embodiment, for keeping the uniformity between the signal outputted from the node NDO of the first transistor M01 and the second transistor M02 in the output stage circuit 302 and the output signal outputted from the amplifying circuit 301, the first transistor M01 and the second transistor have to conform to the following conditions:

1. The transistors M01 and M02 must operate in the saturation region.
2. The DC bias current between the source terminal and the drain terminal of the transistors M01 and M02 should be predictable.

Nevertheless, the gate bias of the first transistor M01 is different from the gate bias of the second transistor M02. Thus, it is necessary that there is a difference value between the DC bias of the node NDA and the DC bias of the node NDB. In addition, the less variation of the abovementioned difference value is preferable when the common voltages (small signal) of the nodes NDA and NDB are varied.

In this embodiment, the third transistor M03 and the fourth transistor M04 are configured as a differential amplifier. The gate terminals of the fifth transistor M05 and the sixth transistor M06 are coupled to a constant bias Vbn2 so that the transistors M05 and M06 can be regard as current sources. Since the gate terminal of the fourth transistor M04 is coupled to a constant bias Vp2, the DC biases of the nodes NDA and NDB and the difference between the DC bias of the node NDA and the DC bias of the node NDB can be controlled as long as the gate voltage of the third transistor M03 is controlled. In addition, the small signals of the nodes NDA and NDB are varied in the same phase whereas the first output signal S1 the amplifying circuit 301 outputs is inputted from the point coupled to the second current source 102, a fifth transistor M05 and the sixth transistor M06.

For reducing the distortion of the output signal Vout, the voltage difference between the nodes NDA and NDB is preferably fixed. Thus, in this embodiment, the differential value amplifying circuit DA30 is coupled to the nodes NDA and NDB to respectively receive the voltages of the nodes NDA and NDB, and compares the voltage difference between the voltages of nodes NDA and NDB with a constant differential value to control the gate voltage of the third transistor M03. Since the voltages of the nodes NDA and NDB and the first output signal S1 outputted from the amplifying circuit 301 are varied in the same phase, theoretically, the voltage difference between the nodes NDA and NDB should not vary as the first output signal S1. Thus, the differential value amplifying circuit DA30 is for comparing the voltage difference between the voltages of the nodes NDA and NDB with the constant differential value. When the voltage difference between the voltages of the nodes NDA and NDB is smaller than the constant differential value, the differential value amplifying circuit DA30 increases the control voltage Vc inputted to the gate terminal of the third transistor M03 so as to increase the voltage difference between the nodes NDA and NDB. When the voltage difference between the nodes NDA and NDB is larger than the constant differential value, the differential value amplifying circuit DA30 reduces the control voltage Vc so as to reduce the voltage difference between the nodes NDA and NDB.

Referring to FIG. 3, in the abovementioned embodiment, the first current source 101 and the second current source 102 can be implemented by use of a simple current mirror circuitry, thus, the maximum numbers of the cascaded transistors between the common voltages VDD and VSS is 4 in the operational amplifier 31. The circuitry of the operational amplifier 31 is therefore adapted to operation in lower supply voltage. In addition, the control voltage Vc is merely controlled by the voltage difference between the voltages of the nodes NDA and NDB. Hence, no matter how the common voltage of the nodes NDA and NDB varies, the control voltage Vc will not be effected. For this reason, the distortion of the output signal Vout is smaller than the distortion of the output signal outputted from the circuit in FIG. 2.

It should be noted that although in the aforementioned embodiment, possible forms of the operational amplifier and the output stage circuit of an embodiment of the present invention have been depicted, people having ordinary skill in the art should know that manufacturers have different designs of the bias circuit BA302 and the amplifying circuit 302. Therefore, the application of the present invention should not be limited to these possible forms. In other words, it conforms to the essence of the present invention as long as the design of the bias circuit BA302 uses the principle of differential amplifier, where a differential input terminal of the differential amplifier is used for inputting a control voltage and the control voltage is generated by comparing the voltage difference between two gate terminals of two transistors of the output stage circuit with a constant differential value, even if there are some differences in circuitry or in signal process.

Next, an another embodiment of the operational amplifier 31 is described in the following so that people having ordinary skill in the art can easily understand the essence of the present invention.

Figure 4:
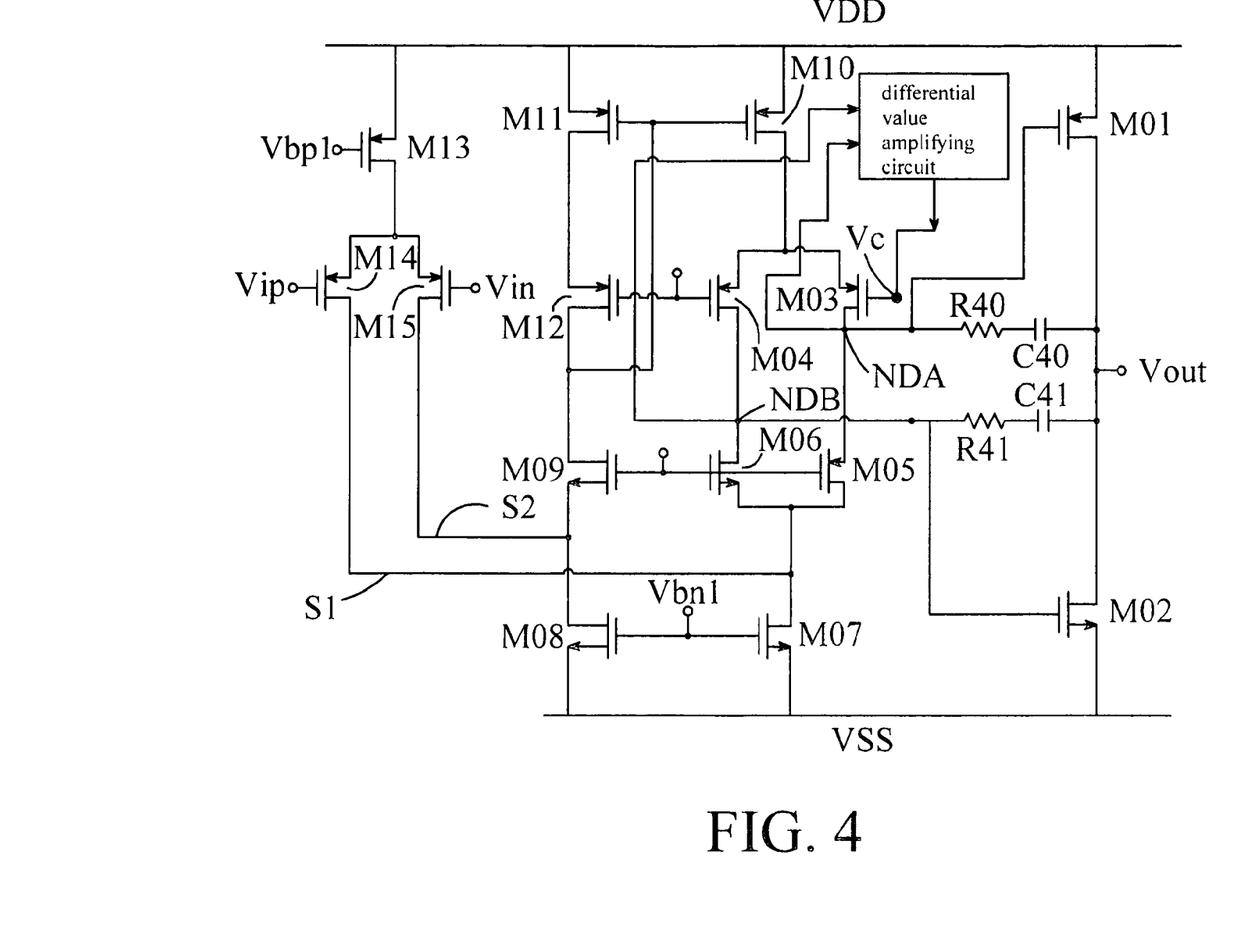
FIG. 4 illustrates a detail circuit diagram of the operational amplifier 31 according to an embodiment of the present invention.

FIG. 4 illustrates a detail circuit diagram of the operational amplifier 31 according to an embodiment of the present invention. Referring to FIG. 4, in this embodiment, the second current source 102 is implemented by the seventh transistor M07 whose gate terminal receives a constant bias Vbn1. The first current source 101 in FIG. 3 is implemented by the tenth transistor M10, the eleventh transistor M11 and the twelfth transistor M12 which are configured as a current mirror, wherein the gate terminal of the twelfth transistor M12 and the gate terminal of the fourth transistor M04 simultaneously receive the constant bias Vbp2. In addition, the bias circuit BA302 includes the eighth transistor M08 and the ninth transistor M09, wherein the gate terminal of the eighth transistor M08 receives the constant bias Vbn1 and the gate terminal of the ninth transistor M09 receives the constant bias Vbn2. The amplifying circuit 301 is implemented by the thirteenth transistor M13, the fourteenth transistor M14 and the fifteenth transistor M15, wherein the fourteenth transistor M14 and the fifteenth transistor M15 are configured as a differential pair. The gate terminal of the thirteenth transistor M13 receives the constant bias Vbp1 for supplying the DC bias current to the fourteenth transistor M14 and the fifteenth transistor M15. In addition, there are the resistors R40 and R41 and the capacitors C40 and C41 correspondingly coupled between the gate terminal and the drain terminal of the first transistor M01 and the gate terminal and the drain terminal of the second transistor M02 for frequency compensation so as to increase the stability of the operational amplifier 31.

In view of FIG. 4, the transistors M03 to M15 are configured as a folded-cascode configuration. The gate terminals of the fourteenth transistor M14 and the fifteenth transistor M15 respectively receive a positive input signal Vip and a negative input signal Vin. The drain terminals of the fourteenth transistor M14 and the fifteenth transistor M15 respectively output a positive output signal S2 and a negative output signal S1. The output signals S1 and S2 are transmitted to the nodes NDA and NDB through the folded-cascode configuration.

Figure 5:
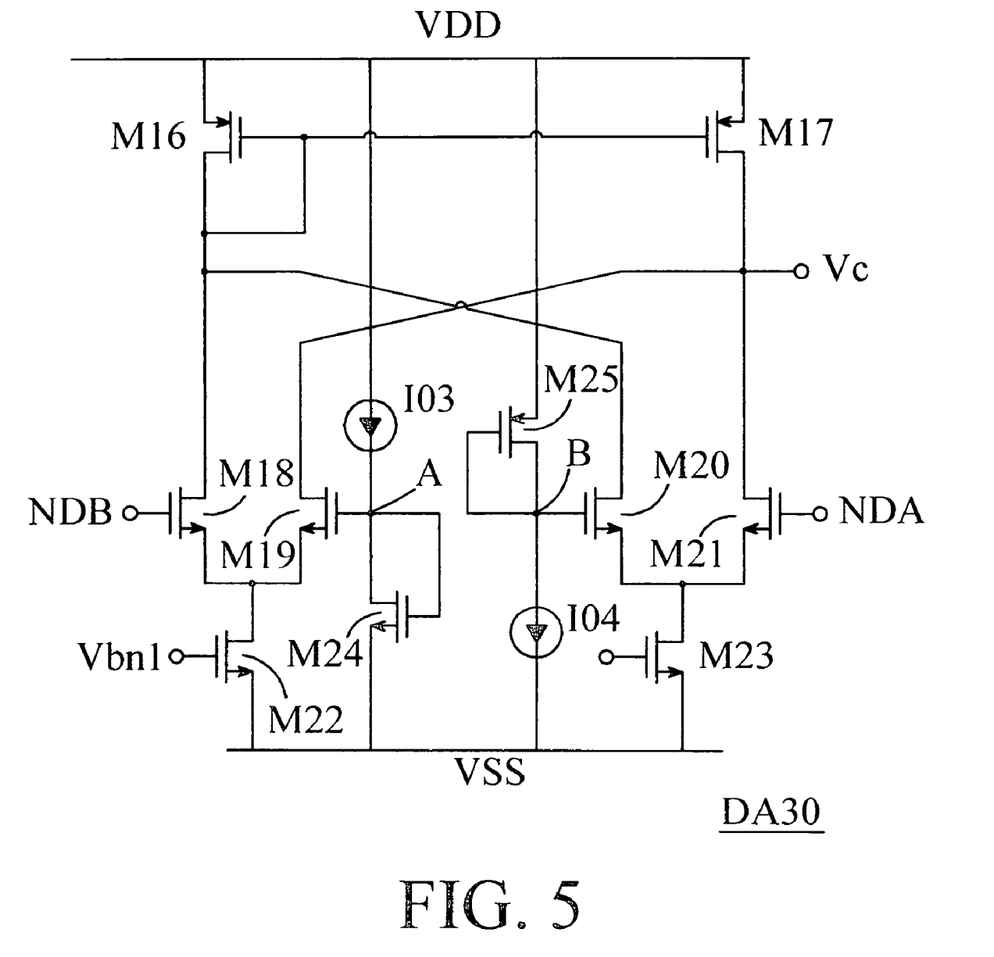
FIG. 5 illustrates a detail circuit diagram of the differential value amplifying circuit DA30 according to an embodiment of the present invention.

FIG. 5 illustrates a detail circuit diagram of the differential value amplifying circuit DA30 according to an embodiment of the present invention. Referring to FIG. 5, the circuit includes the sixteenth transistor M16, the seventeenth transistor M17, the eighteenth transistor M18, the nineteenth transistor M19, the twentieth transistor M20, the twenty-first transistor M21, the twenty-second transistor M22, the twenty-third transistor M23, the twenty-fourth transistor M24 and the twenty-fifth transistor M25. The coupling relationship thereof is shown in FIG. 5. In this embodiment, the transistors M18 and M19 are configured as a differential pair, and the transistors M20 and M21 are configured as another differential pair. The transistors M16, M17, M22 and M23 are used to provide biases for the abovementioned differential pairs. The gate terminal of the eighteenth transistor M18 is coupled to the node NDB. The gate terminal of the nineteenth transistor M19 is coupled to the gate terminal of the twenty-fourth transistor M24. The gate terminal of the twenty-first transistor M21 is coupled to the node NDA. The gate terminal of the twentieth transistor M20 is coupled to the gate terminal of the twenty-fifth transistor M25.

Since the gate terminals of the twenty-fourth transistor M24 and the twenty-fifth transistor M25 are respectively coupled to the drain terminals of the twenty-fourth transistor M24 and the twenty-fifth transistor M25, meaning that the diode is connected. The voltages of the gate terminals and the drain terminals of the twenty-fourth transistor M24 and the twenty-fifth transistor M25 can be controlled as long as the current flow through the twenty-fourth transistor M24 and the twenty-fifth transistor M25 is appropriately controlled by the control of the current sources 103 and 104. Assuming the drain voltage of the twenty-fourth transistor M24 is a first error voltage, representing A, assuming the drain voltage of the twenty-fifth transistor M25 is a second error voltage, representing B, the voltage of the node NDA represents Y', and the voltage of the node NDB represents X. Thus, the control voltage can be represented as following:

$$Vc = G[(X+A)-(Y+B)] = G[(X-Y)-(A-B)]$$

Wherein the mark G represents the gain of the amplifier. Therefore, the control voltage Vc can be controlled as long as the gain and the error voltages A and B are appropriately designed, and the voltages X and Y of the nodes NDA and NDB can be controlled. In addition, due to the design of the differential value amplifying circuit DA30, the control voltage Vc merely relates to the voltage difference between the voltages X and Y of the nodes NDA and NDB, and it does not relates to the common voltage of the voltages X and Y. Therefore, the distortion of the output voltage Vout in this embodiment comparatively is smaller than the distortion of the output signal outputted from the circuit in FIG. 2.

Figure 6:
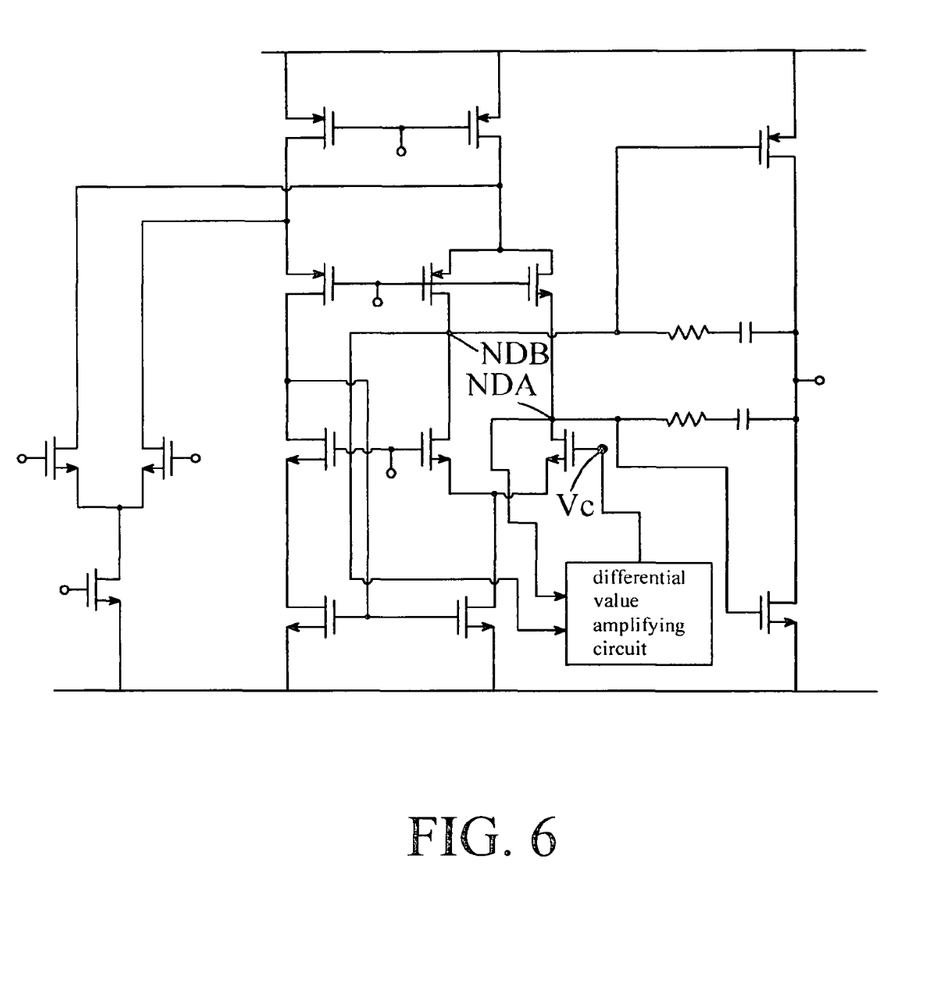
FIG. 6 illustrates another detail circuit diagram of the operational amplifier 31 according to an embodiment of the present invention.
Figure 7:
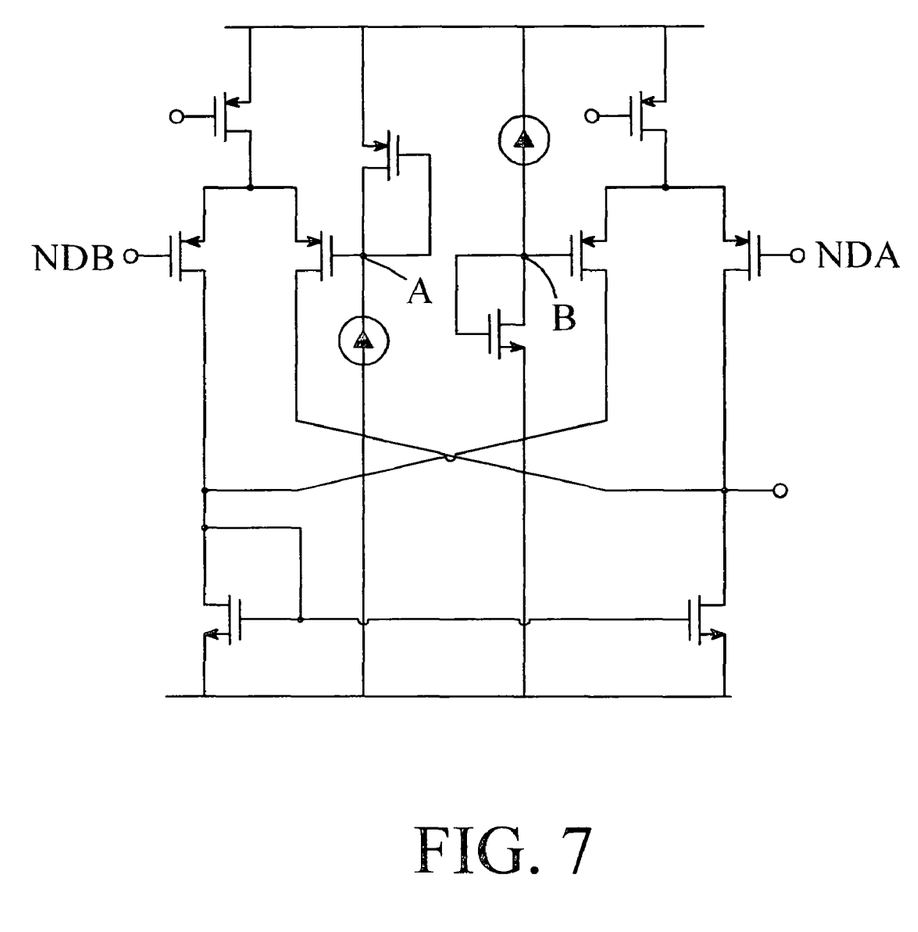
FIG. 7 illustrates a detail circuit diagram of the differential value amplifying circuit DA30 according to an embodiment of the present invention.

A detail embodiment is provided above, but people having ordinary skill in the art should know it conform to the essence of the present invention if the design of the FIG. 4 is modified as FIG. 6. Similarly, it conforms to an application of the essence of the present invention if the design of the FIG. 5 is modified as FIG. 7. Thus, the present invention is not limited to the embodiments of the FIG. 4 to FIG. 7.

To sum up, the design of the bias circuit in output stage circuit of the embodiment of the present invention merely adopts 4 transistors cascaded between the first common voltage VDD and the second common voltage VSS. In addition, the design of the bias circuit uses a differential amplifier, where a differential input terminal thereof is used for inputting a control voltage Vc, and the control voltage Vc is generated from comparing the voltage difference between two gate voltages of two transistors M01 and M02 in the output stage circuit with a constant differential value. The control voltage Vc does not vary as the common voltage of the gate voltages of the two transistors M01 and M02 in the output stage circuit. Therefore, the above-mentioned voltage difference can be accurately controlled within a preset range, and the distortion of the output signal can be therefore reduced.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An output stage circuit for enhancing a driving capability of an output signal outputted by an amplifying circuit, the output stage circuit comprising:
    a first node;
    a second node;
    an output unit, comprising:
        a first transistor, a first source/drain terminal thereof coupled to a first common voltage, a gate terminal thereof coupled to the first node; and
        a second transistor, a first source/drain terminal thereof coupled to a second source/drain terminal of the first transistor, a second source/drain terminal thereof coupled to a second common voltage, a gate terminal thereof coupled to the second node;
    a bias circuit, comprising:
        a first current source, a first terminal thereof coupled to the first common voltage;
        a third transistor, a first source/drain terminal thereof coupled to a second terminal of the first current source, a second source/drain terminal thereof coupled to the first node, a gate terminal thereof receives a control voltage;
        a fourth transistor, a first source/drain terminal thereof coupled to the second terminal of the first current source, a second source/drain terminal thereof coupled to the second node, a gate terminal thereof receives a first constant bias;
        a fifth transistor, a first source/drain terminal thereof coupled to the first node, a gate terminal thereof receives a second constant bias;
        a sixth transistor, a first source/drain terminal thereof coupled to the second node, a gate terminal thereof receives the second constant bias;
        a second current source, wherein a first terminal thereof is coupled to second source/drain terminals of the fifth transistor and sixth transistor, and receives the first output signal outputted from the amplifying circuit, and a second terminal thereof is coupled to the second common voltage; and
    a differential value amplifying circuit, a first input terminal thereof coupled to the first node, a second input terminal thereof coupled to the second node, wherein the differential value amplifying circuit is used for comparing a voltage difference between the first node and the second node with a constant differential value to generate the control voltage so as to control the voltage difference between the first node and the second node within a preset range.

2. The output stage circuit according to claim 1, wherein the second current source comprises:
    a seventh transistor, wherein a gate terminal thereof receives a third constant bias, a first source/drain terminal thereof corresponds to the first terminal of the second current source, and a second source/drain terminal thereof corresponds to the second terminal of the second current source.

3. The output stage circuit according to claim 2, further comprising:
    an eighth transistor, a first source/drain terminal thereof receiving a second output signal outputted from the amplifying circuit, a second source/drain terminal thereof coupled to the second common voltage, a gate terminal thereof coupled to the gate terminal of the seventh transistor; and
    a ninth transistor, a gate terminal thereof coupled to the gate terminals of the fifth transistor and sixth transistor, a second source/drain terminal thereof coupled to the first source/drain terminal of the eighth transistor.

4. The output stage circuit according to claim 1, wherein the first current source comprises:
    a tenth transistor, wherein a first source/drain terminal thereof is the first terminal of the first current source, and a second source/drain terminal thereof is the second terminal of the first current source;
    an eleventh transistor, a gate terminal thereof coupled to a gate terminal of the tenth transistor, a first source/drain terminal thereof coupled to the first common voltage; and
    a twelfth transistor, a gate terminal thereof coupled to the gate terminal of the fourth transistor, a first source/drain terminal thereof coupled to a second source/drain terminal of the eleventh transistor, a second source/drain terminal thereof coupled to the gate terminal of the eleventh transistor.

5. The output stage circuit according to claim 1, wherein the amplifying circuit comprises:
    a thirteenth transistor, a first source/drain terminal thereof coupled to the first common voltage, a gate terminal thereof receiving a fourth constant bias;
    a fourteenth transistor, a first source/drain terminal thereof coupled to a second source/drain terminal of the thirteenth transistor, a gate terminal thereof receiving a first input signal, a second source/drain terminal thereof outputting the first output signal; and
    a fifteenth transistor, a first source/drain terminal thereof coupled to the second source/drain terminal of the thirteenth transistor, a gate terminal thereof receiving a second input signal, a second source/drain terminal thereof outputting a second output signal.

6. The output stage circuit according to claim 1, further comprising:
    a first frequency compensating circuit, a first terminal thereof coupled to the second source/drain terminal of the first transistor, a second terminal thereof coupled to the first node, for frequency compensation; and
    a second frequency compensating circuit, a first terminal thereof coupled to the first source/drain terminal of the second transistor, a second terminal thereof coupled to the second node, for frequency compensation.

7. The output stage circuit according to claim 6, wherein the first frequency compensating circuit comprises:
    a resistor, a first terminal thereof coupled to the first node; and
    a capacitor, a first terminal thereof coupled to a second terminal of the resistor, a second terminal thereof coupled to the second source/drain terminal of the first transistor.

8. The output stage circuit according to claim 6, wherein the second frequency compensating circuit comprises:

a resistor, a first terminal thereof coupled to the second node; and a capacitor, a first terminal thereof coupled to a second terminal of the resistor, a first terminal thereof coupled to the second source/drain terminal of the second transistor.

9. The output stage circuit according to claim 1, wherein the first common voltage corresponds to a power supply voltage and the second common voltage corresponds to a ground voltage.

10. The output stage circuit according to claim 1, wherein the differential value amplifying circuit comprises:

a sixteenth transistor, a first source/drain terminal thereof coupled to the first common voltage, a gate terminal thereof coupled to a second source/drain terminal thereof;

a seventeenth transistor, a first source/drain terminal thereof coupled to the first common voltage, a gate terminal thereof coupled to the gate terminal of the sixteenth transistor;

an eighteenth transistor, a first source/drain terminal thereof coupled to the second source/drain terminal of the sixteenth transistor, a gate terminal thereof coupled to the second node;

a nineteenth transistor, a first source/drain terminal thereof coupled to a second source/drain terminal of the seventeenth transistor and outputting the control voltage, a gate terminal thereof receiving a first error voltage;

a twentieth transistor, a first source/drain terminal thereof coupled to the second source/drain terminal of the sixteenth transistor, a gate terminal thereof receiving a second error voltage;

a twenty-first transistor, a first source/drain terminal thereof coupled to the second source/drain terminal of the seventeenth transistor and outputting the control voltage, a gate terminal thereof coupled to the first node;

a twenty-second transistor, a gate terminal thereof receiving the first constant bias, a first source/drain terminal thereof coupled to the second source/drain terminals of the eighteenth transistor and the nineteenth transistor, a second source/drain terminal thereof coupled to the second common voltage; and a twenty-third transistor, a gate terminal thereof receiving the first constant voltage, a first source/drain terminal thereof coupled to the second source/drain terminal of the twentieth transistor and the twenty-first transistor, a second source/drain terminal thereof coupled to the second common voltage.

11. The output stage circuit according to claim 10, wherein the differential value amplifying circuit further comprises:

a third current source, a first terminal thereof coupled to the first common voltage;

a twenty-fourth transistor, a first source/drain terminal thereof coupled to a gate terminal thereof and a second terminal of the third current source and generating the first error voltage, a second source/drain terminal thereof coupled to the second common voltage;

a twenty-fifth transistor, a first source/drain terminal thereof coupled to the first common voltage, a second source/drain terminal thereof coupled to a gate terminal thereof and generating the second error voltage; and a fourth current source, a first terminal thereof coupled to the second source/drain terminal of the twenty-fifth transistor, a second terminal thereof coupled to the second common voltage.

12. An operational amplifier, comprising:
a amplifying circuit, for outputting a first output signal;

a bias circuit, for outputting a first input voltage and a second input voltage according to a control voltage and the first input signal, wherein the control voltage is for controlling direct current (DC) bias components of the first input voltage and the second input voltage, the first input signal is for controlling a voltage difference between the first input voltage and the second input voltage;

an output stage circuit, for outputting an output signal according to the first input voltage and the second input voltage; and a differential value amplifying circuit, coupled to the output stage circuit, for comparing the voltage difference between the first input voltage and the second input voltage with a constant differential value to generate the control voltage so as to control the DC bias components of the first input voltage and the second input voltage.

13. The operational amplifier according to claim 12, wherein the output stage circuit comprises:

a first node, receiving the first input voltage;
a second node, receiving the second input voltage;
a first transistor, a first source/drain terminal thereof coupled to a first common voltage, a gate terminal thereof coupled to the first node; and
a second transistor, a first source/drain terminal thereof coupled to a second source/drain terminal of the first transistor, a second source/drain terminal thereof coupled to a second common voltage, a gate terminal thereof coupled to the second node.

14. The operational amplifier according to claim 12, wherein the bias circuit comprises:

a first current source, a first terminal thereof coupled to the first common voltage;

a third transistor, a first source/drain terminal thereof coupled to a second terminal of the first current source, a second source/drain terminal thereof outputting the first input voltage, a gate terminal thereof receiving the control voltage;

a fourth transistor, a first source/drain terminal thereof coupled to the second terminal of the first current source, a second source/drain terminal thereof outputting the second input voltage, a gate terminal thereof receiving a first constant bias;

a fifth transistor, a first source/drain terminal thereof coupled to the second source/drain terminal of the third transistor, a gate terminal thereof receiving a second constant bias;

a sixth transistor, a first source/drain terminal thereof coupled to the second source/drain terminal of the fourth transistor, a gate terminal thereof receiving the second constant bias; and a second current source, a first terminal thereof coupled to second source/drain terminals of the fifth transistor and sixth transistor and receiving the first output signal outputted from the amplifying circuit, a second terminal thereof coupled to the second common voltage.

15. The operational amplifier according to claim 14, wherein the second current source comprises:

a seventh transistor, a gate terminal thereof receiving a third constant bias, wherein a first source/drain terminal thereof is the first terminal of the second current source, and a second source/drain terminal thereof is the second terminal of the second current source.

16. The operational amplifier according to claim 15, further comprising:

an eighth transistor, a first source/drain terminal thereof receiving a second output signal outputted from the amplifying circuit, a second source/drain terminal thereof coupled to the second common voltage, a gate terminal thereof coupled to the gate terminal of the seventh transistor; and a ninth transistor, a gate terminal thereof coupled to the gate terminals of the fifth transistor and the sixth transistor, a second source/drain terminal thereof coupled to the first source/drain terminal of the eighth transistor.

17. The operational amplifier according to claim 14, wherein the first current source comprises:

a tenth transistor, wherein a first source/drain terminal thereof is the first terminal of the first current source, a second source/drain terminal thereof is the second terminal of the first current source;

an eleventh transistor, a gate terminal thereof is coupled to a gate terminal of the tenth transistor, a first source/drain terminal thereof coupled to the first common voltage; and a twelfth transistor, a gate terminal thereof coupled to the gate terminal of the fourth transistor, a first source/drain terminal thereof coupled to a second source/drain terminal of the eleventh transistor, a second source/drain terminal thereof coupled to the gate terminal of the eleventh transistor.

18. The operational amplifier according to claim 12, wherein the amplifying circuit comprises:

a thirteenth transistor, a first source/drain terminal thereof coupled to the first common voltage, a gate terminal thereof receiving a fourth constant bias;

a fourteenth transistor, a first source/drain terminal thereof coupled to a second source/drain terminal of the thirteenth transistor, a gate terminal thereof receiving a first input signal, a second source/drain terminal thereof outputting the first output signal; and a fifteenth transistor, a first source/drain terminal thereof coupled to the second source/drain terminal of the thirteenth transistor, a gate terminal thereof receiving a second input signal, a second source/drain terminal thereof outputting a second output signal.

19. The operational amplifier according to claim 13, further comprising:

a first frequency compensating circuit, a first terminal thereof coupled to the second source/drain terminal of the first transistor, a second terminal thereof coupled to the first node, for frequency compensation; and a second frequency compensating circuit, a first terminal thereof coupled to the first source/drain terminal of the second transistor, a second terminal thereof coupled to the second node, for frequency compensation.

20. The operational amplifier according to claim 19, wherein the first frequency compensating circuit comprises:

a resistor, a first terminal thereof coupled to the first node, and a capacitor, a first terminal thereof coupled to a second terminal of the resistor, a second terminal thereof coupled to the second source/drain terminal of the first transistor.

21. The operational amplifier according to claim 19, wherein the second frequency compensating circuit comprises:

a resistor, a first terminal thereof coupled to the first node; and a capacitor, a first terminal thereof coupled to a second terminal of the resistor, a second terminal thereof coupled to the first source/drain terminal of the second transistor.

22. The operational amplifier according to claim 13, wherein the first common voltage corresponds to a power supply voltage and the second common voltage corresponds to a ground voltage.

23. The operational amplifier according to claim 12, wherein the differential value amplifying circuit comprises a sixteenth transistor, a first source/drain terminal thereof coupled to the first common voltage, a gate terminal thereof coupled to a second source/drain terminal thereof;

a seventeenth transistor, a first source/drain terminal thereof coupled to the first common voltage, a gate terminal thereof coupled to the gate terminal of the sixteenth transistor;

a eighteenth transistor, a first source/drain terminal thereof coupled to the second source/drain terminal of the sixteenth transistor, a gate terminal thereof coupled to the second node;

a nineteenth transistor, a first source/drain terminal thereof coupled to a second source/drain terminal of the seventeenth transistor and outputting the control voltage, a gate terminal thereof receiving a first error voltage;

a twentieth transistor, a first source/drain terminal thereof coupled to the second source/drain terminal of the sixteenth transistor, a gate terminal thereof receiving a second error voltage;

a twenty-first transistor, a first source/drain terminal thereof coupled to the second source/drain terminal of the seventeenth transistor and outputting the control voltage, a gate terminal thereof coupled to the first node;

a twenty-second transistor, a gate terminal thereof receiving the first constant bias, a first source/drain terminal thereof coupled to the second source/drain terminals of the eighteenth transistor and the nineteenth transistor, a second source/drain terminal thereof coupled to the second common voltage; and a twenty-third transistor, a gate terminal thereof receiving the first constant voltage, a first source/drain terminal thereof coupled to the second source/drain terminal of the twentieth transistor and the twenty-first transistor, a second source/drain terminal thereof coupled to the second common voltage.

24. The operational amplifier according to claim 23, wherein the differential value amplifying circuit further comprises:

a third current source, a first terminal thereof coupled to the first common voltage;

a twenty-fourth transistor, a first source/drain terminal thereof coupled to a gate terminal thereof and a second terminal of the third current source and generating the first error voltage, a second source/drain terminal thereof coupled to the second common voltage;

a twenty-fifth transistor, a first source/drain terminal thereof coupled to the first common voltage, a second source/drain terminal thereof coupled to a gate terminal thereof and generating the second error voltage; and a fourth current source, a first terminal thereof coupled to the second source/drain terminal of the twenty-fifth transistor, a second terminal thereof coupled to the second common voltage.

* * * * *